US007812633B1

(12) United States Patent
Lee et al.

(10) Patent No.: US 7,812,633 B1
(45) Date of Patent: Oct. 12, 2010

(54) APPARATUS AND METHOD FOR THE ARITHMETIC OVER-RIDE OF LOOK UP TABLE OUTPUTS IN A PROGRAMMABLE LOGIC DEVICE

(75) Inventors: Andy L. Lee, San Jose, CA (US); David Lewis, Toronto (CA); Philip Pan, Fremont, CA (US); James G. Schleicher, II, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 88 days.

(21) Appl. No.: 11/584,308

(22) Filed: Oct. 20, 2006

Related U.S. Application Data

(60) Provisional application No. 60/789,082, filed on Apr. 3, 2006.

(51) Int. Cl.
*H03K 19/173* (2006.01)
*H01L 25/00* (2006.01)

(52) U.S. Cl. .............................. 326/38; 326/37; 326/47

(58) Field of Classification Search .............. 326/37–50
See application file for complete search history.

(56) References Cited

U.S. PATENT DOCUMENTS

| 5,971,591 | A  | * | 10/1999 | Vona et al. | 700/220 |
| 7,167,022 | B1 | * | 1/2007 | Schleicher et al. | 326/41 |
| 7,298,169 | B2 | * | 11/2007 | Hutchings et al. | 326/38 |
| 7,330,052 | B2 | * | 2/2008 | Kaptanoglu et al. | 326/40 |
| 7,436,208 | B1 | * | 10/2008 | Pham | 326/38 |
| 7,486,110 | B2 | * | 2/2009 | Bhatti et al. | 326/38 |
| 2002/0079921 | A1 | * | 6/2002 | Kaviani et al. | 326/40 |
| 2003/0071653 | A1 | * | 4/2003 | Carberry et al. | 326/40 |
| 2004/0178818 | A1 | * | 9/2004 | Crotty et al. | 326/40 |
| 2005/0146352 | A1 | * | 7/2005 | Madurawe | 326/41 |
| 2005/0275428 | A1 | * | 12/2005 | Schlacter | 326/41 |
| 2005/0289211 | A1 | * | 12/2005 | Minz | 708/700 |

OTHER PUBLICATIONS

"STRATIX II Device Handbook, vol. 1," Altera Corporation, 2007, Downloaded from: http://www.altera.com/literature/hb/stx2/stratix2_handbook.pdf, on Oct. 3, 2007.
"STRATIX II Architecture," Altera Corporation, May 2007, Downloaded from: http://www.altera.com/literature/hb/stx2/stx2_sii51002.pdf, on Oct. 3, 2007.

(Continued)

*Primary Examiner*—Vibol Tan
*Assistant Examiner*—Matthew C Tabler
(74) *Attorney, Agent, or Firm*—Weaver Austin Villeneuve & Sampson, LLP

(57) ABSTRACT

A programmable logic device having a Logic Element with an N-stage Look Up Table (LUT), dedicated hardware for performing a non-LUT logic function, and an over-ride element configured to selectively force a muxing stage within the N-stage LUT to select either one or more LUT configuration bit inputs or the output of the non-LUT logic function as the output of the LUT. In various embodiments, the non-LUT functions can include addition, subtraction, multiplication, division, digital signal processing, memory storage, etc.

28 Claims, 6 Drawing Sheets

OTHER PUBLICATIONS

"VIRTEX 4 Family Overview," Xilinx, Inc., DS112 (v1.3) Mar. 26, 2005, Downloaded from: http://picocomputing.com/pdf/www/E-12/Third%20Party%20Manuals/Virtex-4%20FPGA/Virtex-4%20Overview%20V1.3.pdf, on Oct. 3, 2007.

"STRATIX II Device Handbook, vol. 2," Altera Corporation, 2007, Downloaded from: http://www.altera.com/literature/hb/sfx2/stratix2_handbook.pdf , on Oct. 3, 2007.

* cited by examiner

APPARATUS AND METHOD FOR THE ARITHMETIC OVER-RIDE OF LOOK UP TABLE OUTPUTS IN A PROGRAMMABLE LOGIC DEVICE

CROSS-REFERENCE TO RELATED APPLICATIONS

This application claims priority to U.S. Provisional Patent Application No. 60/789,082, filed Apr. 3, 2006, and entitled "APPARATUS AND METHOD FOR THE ARITHMETIC OVER-RIDE OF LOOK UP TABLE OUTPUTS IN A PROGRAMMABLE LOGIC DEVICE," which is hereby incorporated herein by reference.

BACKGROUND

1. Field of the Invention

The present invention generally relates to programmable logic devices, and more particularly, to a programmable logic device including a Logic Element (LE) with an N-stage Look Up Table (LUT), dedicated hardware for performing a non-LUT logic function, and an over-ride element configured to selectively force a muxing stage within the LUT to select either one or more LUT configuration bit inputs or the output of the non-LUT logic function as the output of the LUT.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. PLDs also include basic logic elements for implementing user defined logic functions, often referred to in the industry by such names as Logic Elements (LEs), Adaptive Logic Modules (ALMs), or Complex Logic Blocks (CLBs). The basic logic elements, regardless of what they are called, usually include one or more look up table (LUTs), registers for generating registered logic outputs, adders and other circuitry to implement various logic and arithmetic functions. For the purposes of the present invention, the term Logic Element as used herein, unless otherwise specified, shall mean a generic logic element, including but not limited to ALMs, CLBs, and LEs.

The Stratix® I device is one type of commercially available PLD, offered by Altera Corporation, assignee of the present application. The Stratix® I PLD includes an array of Logic Array Blocks (LABs) arranged in rows and columns and interconnected by horizontal and vertical lines of various lengths. Each LAB includes, among other elements, ten 4-input Logic Elements or LEs, a local interconnect, and LAB wide control signals. For more information on the Stratix® I device, see for example The Stratix Architecture, Functional Description, pages 2-1 through 2-140, from the Altera Corporation, July, 2005 (Altera Internal document Number S51002-3.2), incorporated by reference herein for all purposes. The Stratix® II device is a more recently available PLD offered by the Altera Corporation. The Stratix® II device includes LABs but differs from the Stratix® I device in that the basic logic building block is an Adaptive Logic Module (ALM) instead of Logic Elements or LEs. ALMS include 6-input fracturable LUTs. For more details on the Stratix® II device, see The Stratix® II Architecture, Functional Description, pages 2-104, The Stratix® II Device handbook, Volume 1, December 2005 (Altera Document Number SII51002-4.0), also incorporated by reference herein for all purposes.

The addition function is commonly performed on PLDs. As consequence, many programmable logic vendors have included dedicated hardware for performing full or partial addition to their Logic Elements. For example, the Logic Elements on the Stratix® I device has both a 4-input LUT and dedicated hardware to generate the Carry Out signal of an adder. The dedicate hardware, however, does not generate a Sum Out signal. Instead, the Sum Out signal is routed through the LUT of the Logic Element. For Stratix I devices, the SUM OUT of the adder thus uses the normal output path used by the LUT. As a result, 2:1 muxes are provided at the output of the Logic Element. The inputs to the muxes include (i) the register output; and (ii) either the LE output or the Sum Out signal through the LE output.

In the Stratix® II device, the adder capability of the ALM was improved. The dedicated hardware is capable of generating both the Carry out and the Sum Out signals, thus implementing a full adder. This allows the LUT to be fully used to perform logic on the inputs to the adder, which enables a more powerful arithmetic capability per ALM. The tradeoff, however, is the output muxes of the ALM have to be 3:1 since there are now three possible output signals, including the ALM output, the Register output and the Sum Out signal. Unfortunately there is a relatively high penalty in using 3:1 output muxes in the ALM because additional die area is required to implement the additional logic.

When the dedicated hardware for performing addition or some other non-LUT logic function is used within a Logic Element or ALM, the LUT is typically not used for performing logic functions. Therefore, the output path reserved for the LUT output can be used to route the output of the non-LUT function. In these cases, a programmable logic device having (i) a Logic Element with dedicated hardware for performing a non-LUT logic function (e.g., and adder) and capable of generating a non-LUT logic function output; and (ii) an over-ride element, coupled to the LUT, and configured to selectively force a muxing stage within the LUT to select either one or more configuration bit inputs, or the non-LUT logic function output, and which can be used to minimize the area cost in implementing the output path for the non-LUT logic, is therefore needed.

SUMMARY OF THE INVENTION

A programmable logic device having a Logic Element with an N-stage Look Up Table (LUT), dedicated hardware for performing a non-LUT logic function and an over-ride element configured to selectively force a muxing stage within the LUT to select either one or more LUT configuration bit inputs or the output of the non-LUT logic function as the output of the LUT. In various embodiments, the non-LUT functions can include addition, subtraction, multiplication, division, digital signal processing, memory storage, etc.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
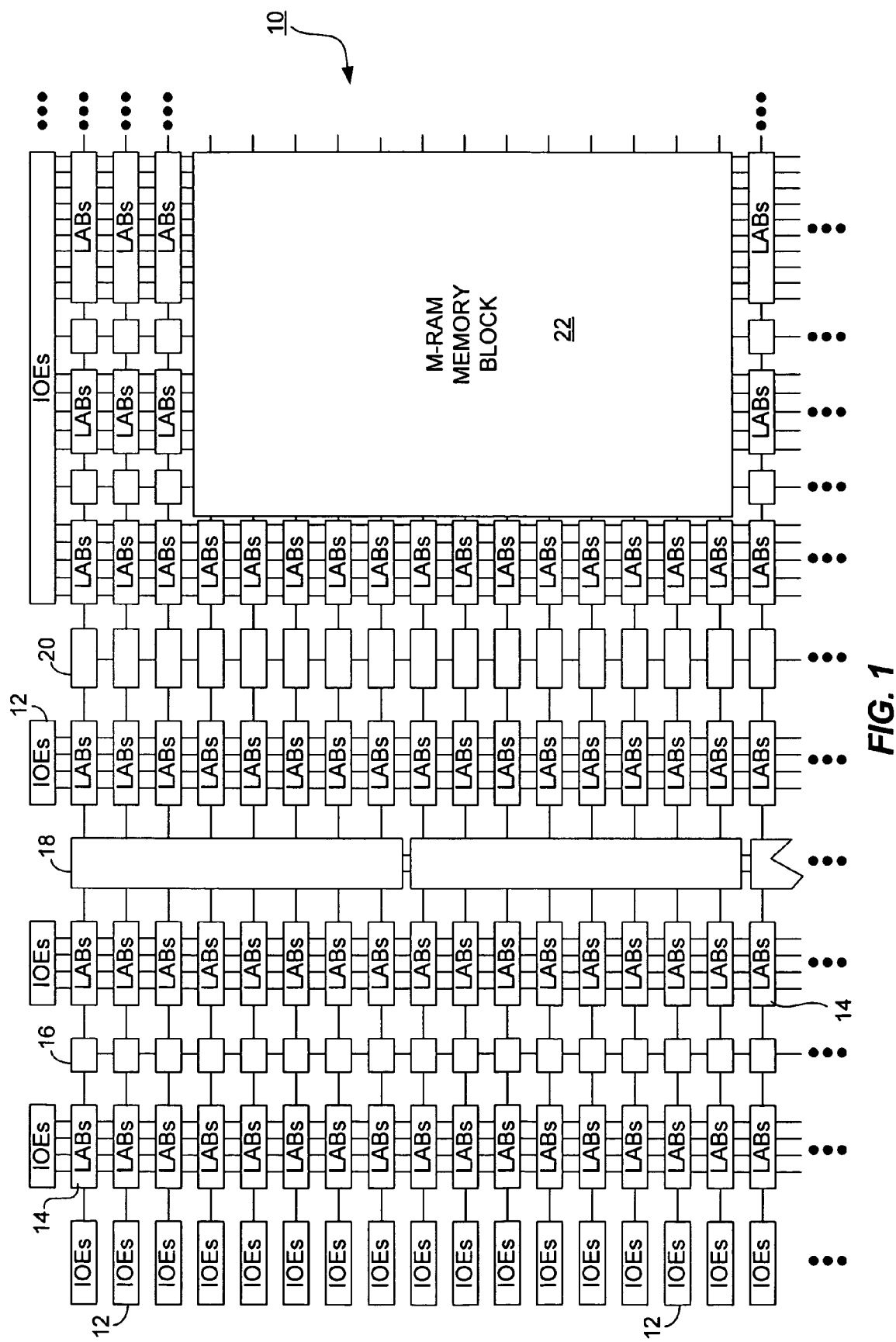
FIG. 1 a block diagram of an exemplary programmable logic device.

Referring to FIG. 1, a block diagram of an exemplary Programmable Logic Device (PLD) of the present invention is shown. The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22 each provided at different locations across the device.

In one embodiment, the LABs 14 include a number of Logic Elements (LEs) (not visible in the figure), which are the basic logic building blocks for implementing user defined logic functions. The RAM blocks 16 are simple dual port memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits. It should be noted that the PLD 10 is merely exemplary and in no way should be construed as limiting the invention. For more information on the specific PLD architecture 10 illustrated in FIG. 1, see for example the above-mentioned Functional Descriptions of the Stratix I and Stratix II devices, incorporated by reference herein. It should also be noted that the practice of the present invention, as described herein, does not require a PLD with the above mentioned functional blocks, listed above. Functional blocks such as the RAM blocks 16, DSP blocks 18, RAM blocks 20, and M-RAM blocks 22 are optional and are not required for the practice of the present invention.

Figure 2:
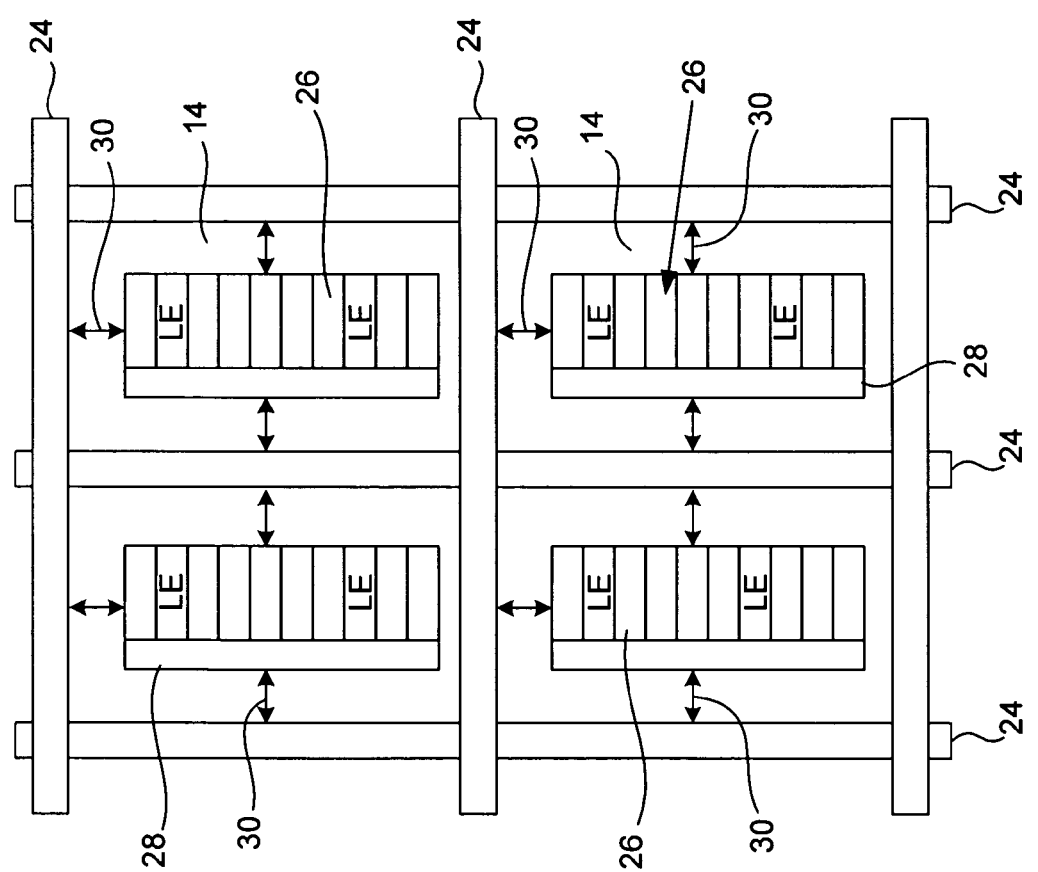
FIG. 2 is a block diagram of a Logic Array Block (LAB) in the exemplary programmable logic device.

Referring to FIG. 2, a block diagram of several logic array blocks (LABs) in an exemplary PLD 10 is shown. The figure shows four LABs 14 interconnected by a plurality of general horizontal (row) and vertical (column) interconnect lines 24. Each LAB 14 includes a plurality of Logic Elements (LEs) 26. In the embodiment shown, there are ten (10) LEs 26 per LAB 14. It should be noted that this number is arbitrary, and that any number of LEs 26 may be used per LAB 14. A LAB wide interconnect 28 is also provided to interconnect the LEs 26 within each LAB 14. Interconnects 30 are provided between the LEs 26 of each LAB 14 and the general horizontal and vertical interconnects 24.

Figure 3:
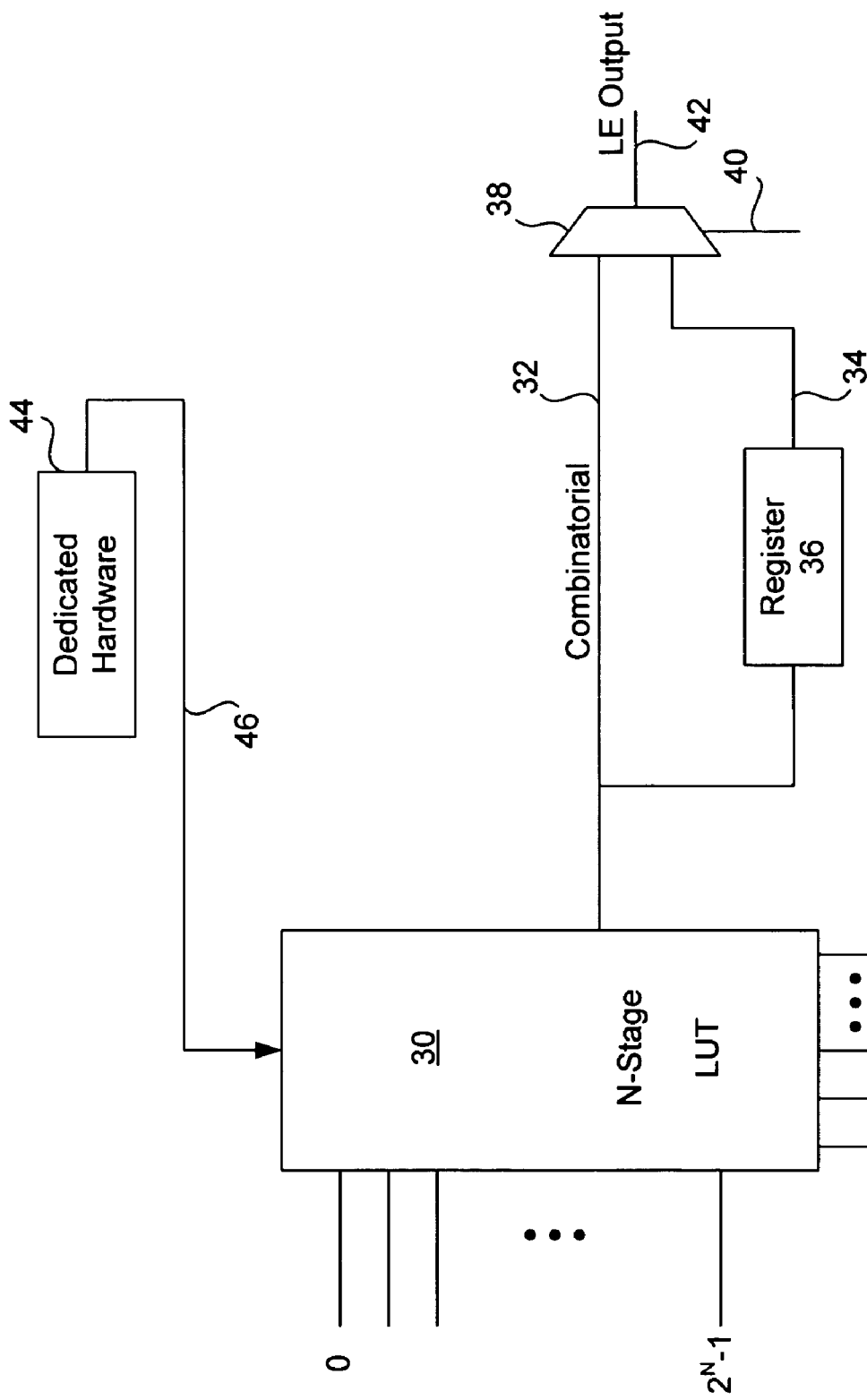
FIG. 3 is a diagram of a Logic Element according to the present invention.

Referring to FIG. 3, a simplified diagram of a Logic Element 26 according to the present invention is shown. The LE 26 includes an N-stage Look Up Table or LUT 30 coupled to receive $2^N$ configuration RAM input bits (labeled 0 through $2^{N-1}$) and N select signals labeled A through N. The LUT 30 is configured to generate a combinational LUT output signal 32 or a registered output signal 34 through register 36. An output 2:1 mux 38 is coupled to receive a select signal 40 and the combinational output 32 and the registered output 36 as inputs. In response to the select signal 40, the mux 38 selects as the LE output signal 42 either the combinational signal 32 or the registered signal 34. The LE 26 also includes dedicated hardware 44 for performing a non-LUT function. The hardware 44 generates a non-LUT function output signal 46. As described in more detail below, the LUT 30 includes an override element that is configured to selectively force a stage within the LUT 30 to output either one or more of the configuration RAM bits or the non-LUT function output signal 46. As a result, the combinatorial output 32 and the registered input associated with the ALM 30 can be either one of the configuration bits or the non-LUT function output signal 46.

Figure 4:
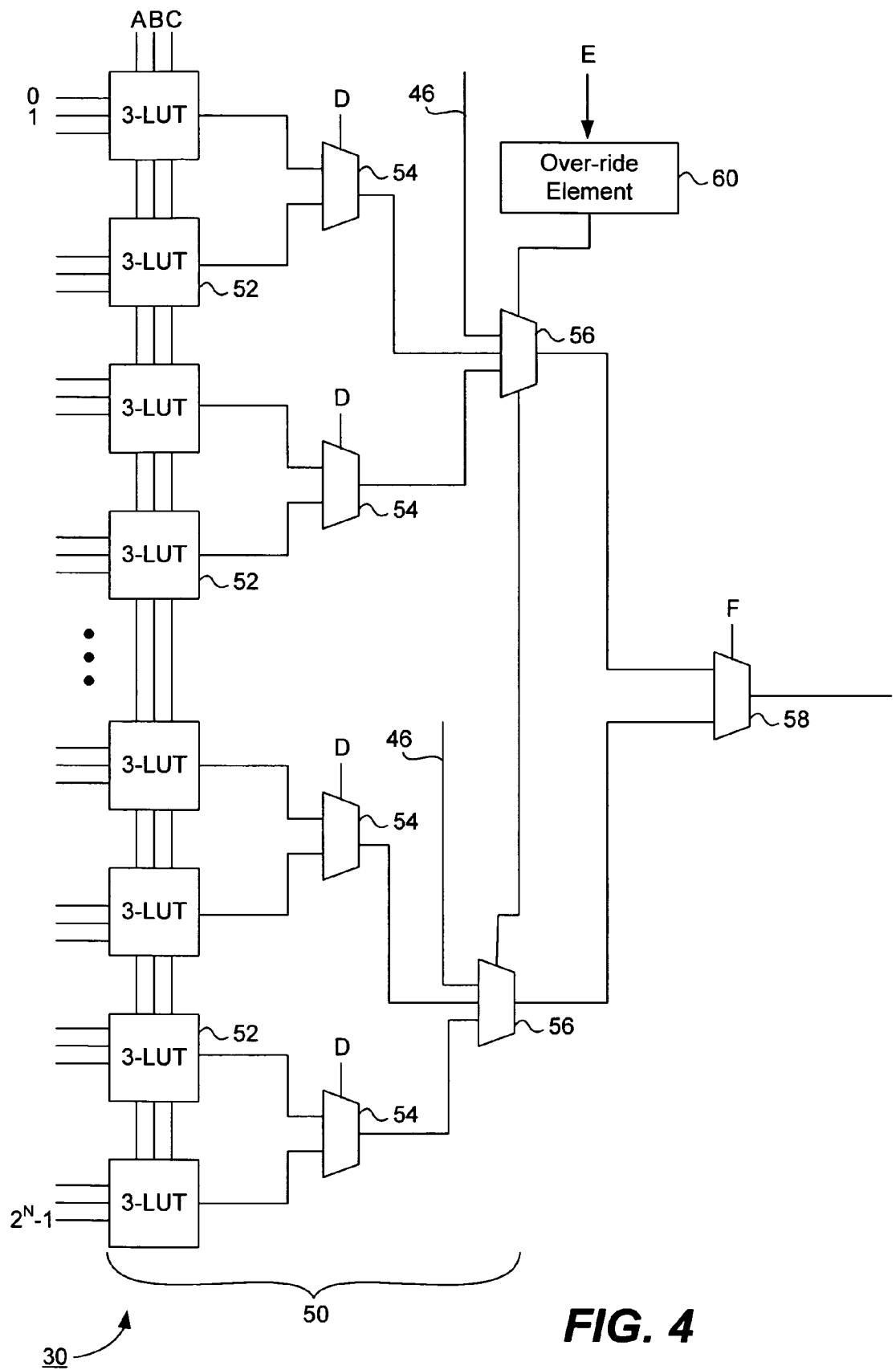
FIG. 4 is a diagram of the muxing structure of the Look Up Table in the Logic Element of the present invention.

Referring to FIG. 4, a diagram of the N-stage muxing structure 50 of the ALM 30 of the present invention is shown. In the embodiment shown, the muxing structure 50 includes five stages (i.e., N=5), each stage controlled by a select signal A through F respectively. The muxing structure 50 includes a plurality of 3-input LUTs 52, each configured to receive control signals A, B and C respectively. (The 3-input LUTs 42 are illustrated in block diagram form herein. The individual mux stages of the 3-input LUTs 42 are not illustrated herein for the sake of simplicity.). The subsequent muxing stage includes a series of 2:1 muxes 54, each coupled to receive the select signal D and two distinct inputs from the LUTs 42. In the next stage, two 3:1 muxes 56 are provided. The muxes 56 are coupled to receive a control signal E and as data inputs the non LUT function output signal 46 and two input from the previous stage muxes 54. Finally, the output mux 58 is coupled to receive control signal F and the output of the two muxes 56.

An over-ride element 60 is provided to generate the control signal E, which is coupled to the select inputs of the two E-stage muxes 46 of LUT 30. The over-ride element 60 is therefore coupled to an "Nth stage" of the LUT 30 and is configured to selectively force the Nth stage (in this embodiment, the E stage muxes 56) within the muxing structure 50 to each select either:

(i) one of the $2^N$ configuration bit inputs; or (ii) the non-LUT logic function output signal 46.

If the over-ride element 60 causes the muxes 56 to both select the non-LUT logic function output signal 46, then this signal is provided at the LUT output. On the other hand, if the E control signal causes both muxes 56 to select a configuration bit, then the output of the LUT will be a configuration bit, as determined by the A-F select signals applied to the LUT 30. In either case, the LUT output signal is provided to the output mux 40 in either combinational or registered form. In one embodiment, the over-ride element 60 is user-controlled. In other words, the over-ride element 60 may include one or more configuration RAM bits (not shown) that enable a user to selectively enable or disable the over-ride function.

In the embodiment shown, the over-ride element 60 is applied to the E stage muxes 56 of the muxing structure 50. It should be noted, however, that the over-ride element 60 may be applied to any one of the stages A through F of the LUT 30.

In another embodiment, the over-ride element 60 can be applied to certain muxes in a selected stage in the muxing structure 50. For example, the over-ride element 60 can be applied to the upper mux 56, but not the lower mux 56, of the E stage of the LUT. In this situation, the non-LUT logic function output signal 46 is provided as one input to the subsequent mux 58, whereas one of the configuration bits is provided as the other input. As a consequence, the F select signal as applied to mux 58 determines the output of the LUT. This may be desirable in some cases where the LUT output logic wants to mux between the non-LUT logic output and a fixed LUT Output (i.e. 5 LUT output in bottom half of 6-LUT 50 as described above). Also, if a tap-off outputs from either of the outputs of muxes 56 existed, it would be possible to override one of the muxes 56, thus allowing the other mux 56 to route an independent 5-LUT output.

In the embodiment shown, the muxing structure 50 of the LUT 30 has six stages (i.e., N=6). It should be understood that this arrangement is exemplary, and the present invention may be applied to a LUT having any number "N" of stages, for example a one stage, two stage, three stage, four stage or six or more stage LUT.

The dedicated hardware 44 for performing the non-LUT logic function is configured to perform one of the following non-LUT functions: addition, subtraction, multiplication, division, digital signal processing, memory storage, or any arbitrary fixed logic function.

Figure 5A:
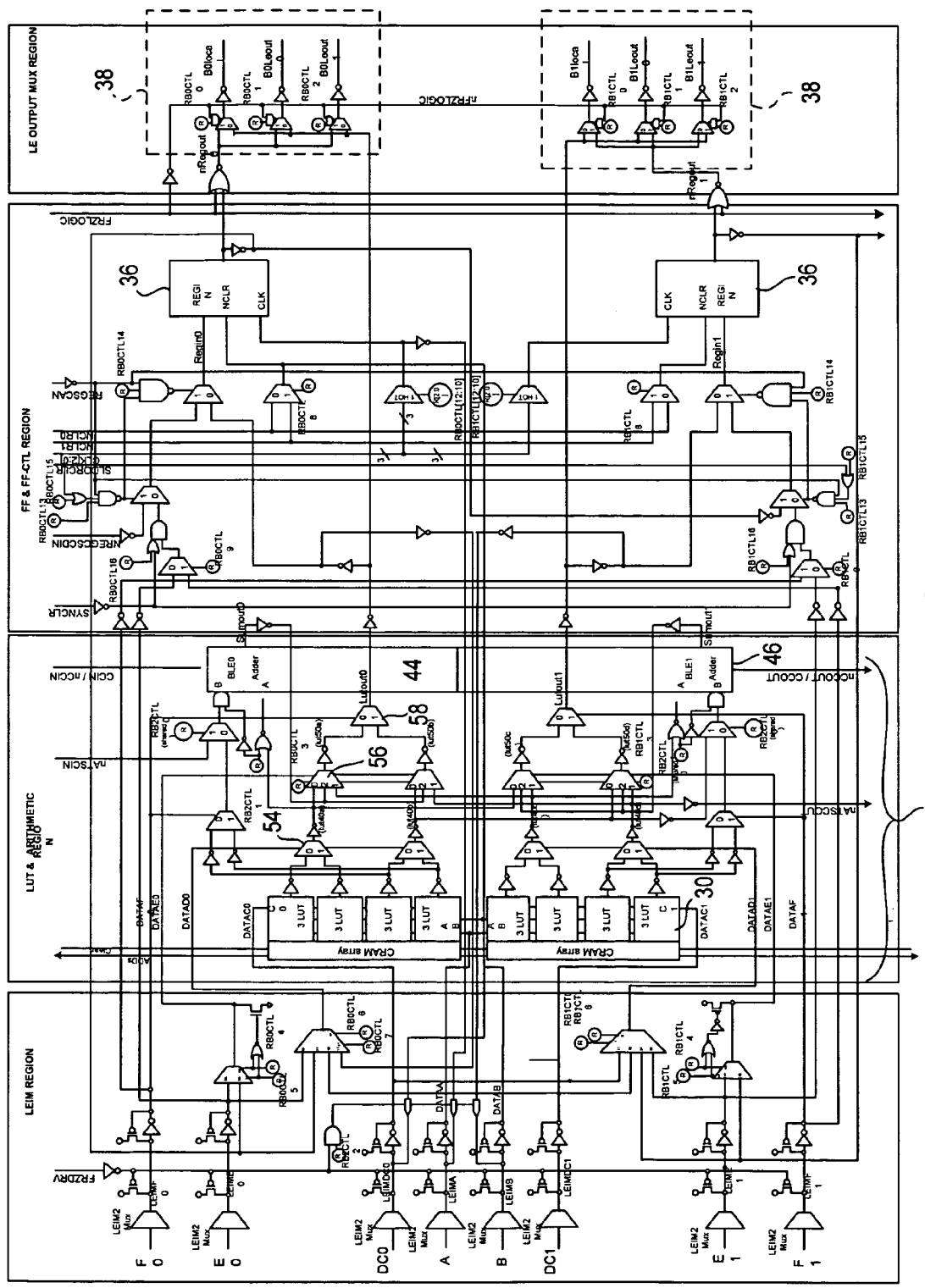
FIGS. 5A and 5B are a logic level diagrams of a Logic Element of the present invention.

Referring to FIG. 5A, an actual logic level diagram of a Logic Element 26 implementing the present invention is shown. In this embodiment, the Logic Element 26 includes the N-stage LUT 30 including the muxing structure 50 including the 3-input LUTs 52 and the muxing stages 54, 56 and 58, a dedicated adder 44, output register 36, and output muxes 38. The Logic Element 26 as shown in FIG. 5A is very similar to the ALM provided on the Stratix® II device, with the addition of the over-ride capability described in the present application. For more details on the Logic Element 26 illustrated in FIG. 5A, see The Stratix® II Architecture, Functional Description, pages 2-104, The Stratix® II Device handbook, Volume 1, December 2005 (Altera Document Number SII51002-4.0), both already incorporated herein by reference.

Figure 5B:
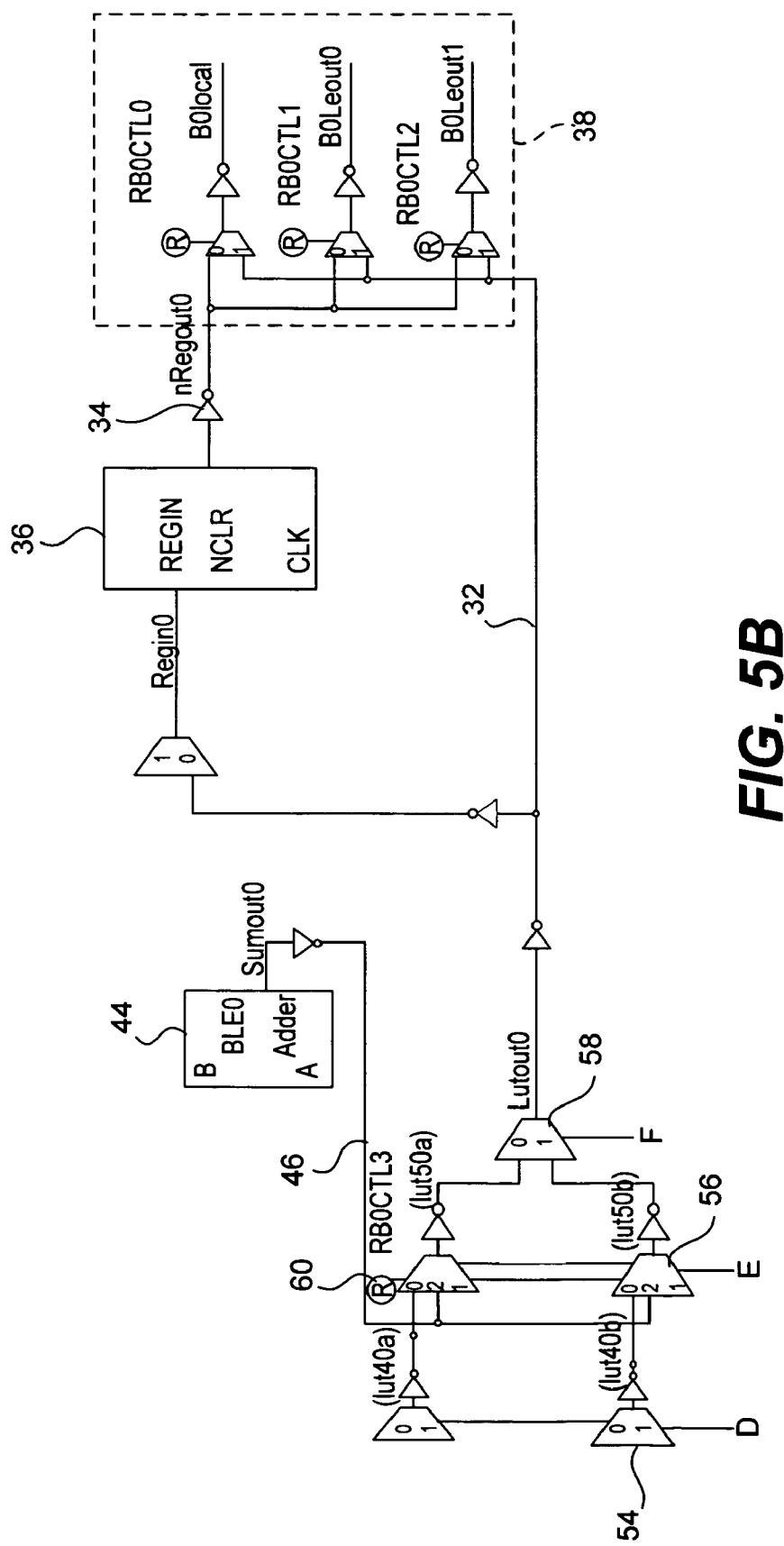

Referring to FIG. 5B, the circuit details of the over-ride function of the Logic Element 26 of FIG. 5A is shown. As illustrated, the dedicated hardware 44 generates a non-LUT function output signal 46 that is applied to the E stage muxes 56 of the muxings structure 50 of the LUT 30. The select signal F controls the final stage mux 58. Both the combinational 32 and registered outputs 34 of the LUT 30 are then provided to the output muxes 38. When configuration RAM (CRAM) bit RB0CTL3 is logic high, mux input 2 is selected for both E stage muxes 56. When RB0CTL3 is logic low, the two E stage muxes route either input 0 or input 1 based on the logical value of input E.

Although the present invention was described in the context of a specific type of programmable logic device having Logic Elements, it should be noted that the present invention can be practiced and used in any type of programmable logic device using look up tables for implementing logic functions. For example, the present invention can be used in programmable gate array (FPGA), including those Complex Logic Blocks as their basic logic block. For more information on Complex Logic Blocks, see the Virtex Family Overview by Xilinx Corporation, Mar. 26, 2005, incorporated by reference herein for all purposes. Similarly, the present invention can be used with PLDs having either ALMs or Logic Elements, as used in the Altera® Stratix II and Stratix I devices respectively.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A programmable logic device, comprising a plurality of logic blocks organized in an array, each of the logic blocks including logic elements, a plurality of the logic elements including:

an N-stage look up table (LUT) structure having configuration bit inputs and a LUT output;

dedicated hardware for performing a non-LUT logic function and for generating a non-LUT logic function output, wherein the non-LUT logic function is one of the following: addition, subtraction, multiplication, division, and digital signal processing; and an over-ride element coupled to the LUT and configured to selectively force a stage within the N stage look up table to select either one or more of the configuration bit inputs or the non-LUT logic function output so that the selected one or more of the configuration bit inputs or the non-LUT logic function output is provided at the LUT output, wherein the over-ride element comprises a register and a configuration random access memory (RAM) bit that allows a user to selectively enable or disable the over-ride function.

2. The programmable logic device of claim 1, wherein the N stage LUT comprises a plurality of muxes organized into the N stages.

3. The programmable logic device of claim 1, wherein the over-ride element is applied to a mux or muxes of a selected stage of the N stage LUT.

4. The programmable logic device of claim 1, wherein the selected stage is followed by one or more of the N stages and the over-ride element is not applied to the mux or muxes of the stages following the selected stage of the N stage LUT.

5. The programmable logic device of claim 2, wherein the over-ride element is applied to all the muxes associated with a selected stage of the N stage LUT.

6. The programmable logic device of claim 2, wherein the over-ride element is applied to a subset of the muxes associated with the selected stage of the N stage LUT, allowing normal LUT logic functions to be provided in subsequent stages of the LUT.

7. The programmable logic device of claim 5, wherein the over-ride element is not applied to the second stage, allowing one of the configuration bit inputs to be provided to the subsequent stages in the LUT.

8. The programmable logic device of claim 5, wherein the over-ride element provided to the selected stage is user controlled, thereby allowing the user to provide either:
 (i) one of the configuration bit inputs to be provided to the subsequent stage or stages in the LUT;
 (ii) the non-LUT logic function output is to be provided to subsequent stage or stages in the LUT; or
 (iii) both one of the configuration bit inputs and the non-LUT logic function output to be provided to subsequent stage or stages in the LUT.

9. The programmable logic device of claim 1, wherein, by user controlling the over-ride element and the selectively forced stage within the N stage look up table, the output signal provided at the LUT output is:
 (i) one of the configuration bit inputs;
 (ii) the non-LUT logic function output; or
 (iii) a logic function derived from one of the configuration bit inputs and the non-LUT logic function output.

10. The programmable logic device of claim 1, wherein the look up table has one of the following configurations:
 (i) six stages (N=6) and sixty-four configuration bit inputs ($2^6$=64);
 (ii) five stages (N=5) and thirty-two configuration bit inputs ($2^5$=32);
 (iii) four stages (N=4) and sixteen configuration bit inputs ($2^4$=16);
 (iv) three stages (N=3) and eight configuration bit inputs ($2^3$=8);
 (v) two stages (N=2) and 4 configuration bit inputs ($2^2$=4);
 (vi) one stage (N=1) and two configuration bit inputs ($2^1$=2); or
 (vii) more than six stages with more than sixty-four configuration bits.

11. The programmable logic device of claim 1, wherein the LUT output is provided to a logic element output through an output mux.

12. The programmable logic device of claim 11, wherein the output mux is coupled to a local interconnect within the logic element.

13. The programmable logic device of claim 11, wherein the output mux is coupled to a global interconnect that interconnects the logic blocks in the array.

14. The programmable logic device of claim 1, further comprising a configuration RAM bit, coupled to the over-ride element, and configured to control the over-ride element.

15. The programmable logic device of claim 1, further comprising a logic element output coupled to receive the selected one or more of the configuration bit inputs or the non-LUT logic function output provided at the LUT output; and a interconnect including a plurality of horizontal and vertical interconnect lines interconnecting the plurality of logic blocks of the array, one or more of the horizontal or vertical lines being selectively connected to the logic element output so that the selected one or more of the configuration bit inputs or the non-LUT logic function output provided at the LUT output can be routed to the plurality of logic blocks in the array.

16. A logic element, comprising:
an N-stage look up table (LUT) having configuration bit inputs and a LUT output;
dedicated hardware for performing a non-LUT logic function and for generating a non-LUT logic function output, the non-LUT logic function output coupled to a selected stage of the N stage LUT, wherein the non-LUT logic function is one of the following: addition, subtraction, multiplication, division, and digital signal processing; and
an over-ride element coupled to the selected stage of the N stage LUT and configured to control the output of the LUT to be either one of the configuration bit inputs or the non-LUT logic function output, wherein the over-ride element comprises a register and a configuration random access memory (RAM) bit that allows a user to selectively enable or disable the over-ride function.

17. The logic element of claim 16, wherein the over-ride element is user controlled, whereby the user can control the over-ride element to selectively force the output of the LUT to be one of the following:
 (i) one of the configuration bit inputs of the LUT;
 (ii) the non-LUT logic function output; or
 (iii) a logic function derived from one of the configuration bit inputs and the non-LUT logic function output.

18. The logic element of claim 16, wherein the LUT has one of the following configurations:
 (i) six stages (N=6) and sixty-four configuration bit inputs ($2^6$=64);
 (ii) five stages (N=5) and thirty-two configuration bit inputs ($2^5$=32);
 (iii) four stages (N=4) and sixteen configuration bit inputs ($2^4$=16);
 (iv) three stages (N=3) and eight configuration bit inputs ($2^3$=8);
 (v) two stages (N=2) and 4 configuration bit inputs ($2^2$=4);
 (vi) one stage (N=1) and two configuration bit inputs ($2^1$=2); or
 (vii) more than six stages with more than sixty-four configuration bits.

19. A method comprising:
providing an N-stage look up table (LUT) having configuration bit inputs and a LUT output;
providing dedicated hardware for performing a non-LUT logic function and for generating a non-LUT logic function output, the non-LUT logic function output coupled to a selected stage of the N stage LUT, wherein the non-LUT logic function is one of the following: addition, subtraction, multiplication, division, and digital signal processing; and
providing an over-ride element, coupled to the selected stage of the N stage LUT and configured to control the output of the LUT to be either one of the configuration bit inputs or the non-LUT logic function output, wherein the over-ride element comprises a register and a configuration random access memory (RAM) bit that allows a user to selectively enable or disable the over-ride function.

20. The method of claim 19, wherein the provided over-ride element is user controlled, whereby the user can control the over-ride element to selectively force the output of the LUT to be one of the following:
  (i) one of the configuration bit inputs of the LUT;
  (ii) the non-LUT logic function output; or
  (iii) a logic function derived from one of the configuration bit inputs and the non-LUT logic function output.

21. The method of claim 19, wherein the provided LUT has one of the following configurations:
  (i) six stages (N=6) and sixty-four configuration bit inputs ($2^6$=64);
  (ii) five stages (N=5) and thirty-two configuration bit inputs ($2^5$=32);
  (iii) four stages (N=4) and sixteen configuration bit inputs ($2^4$=16);
  (iv) three stages (N=3) and eight configuration bit inputs ($2^3$=8);
  (v) two stages (N=2) and 4 configuration bit inputs ($2^2$=4);
  (vi) one stage (N=1) and two configuration bit inputs ($2^1$=2); or
  (vii) more than six stages with more than sixty-four configuration bits.

22. A programmable logic device comprising a dedicated circuit and a look up table (LUT), the LUT having multiple stages and an output circuit, wherein the dedicated circuit is coupled directly to a stage of the LUT, wherein the LUT is configurable so that a signal generated by the dedicated circuit and output by the LUT is routed through the stage, and wherein the dedicated circuit is configured to perform one of the following functions: addition, subtraction, multiplication, division, and digital signal processing, wherein the over-ride element comprises a register and a configuration random access memory (RAM) bit that allows a user to selectively enable or disable the over-ride function.

23. The programmable logic device of claim 1 wherein the non-LUT logic function is addition.

24. The programmable logic device of claim 1 wherein the non-LUT logic function is subtraction.

25. The programmable logic device of claim 1 wherein the non-LUT logic function is multiplication.

26. The programmable logic device of claim 1 wherein the non-LUT logic function is division.

27. The programmable logic device of claim 1 wherein the non-LUT logic function is digital signal processing, the dedicated hardware is a finite impulse response (FIR) filter.

28. The programmable logic device of claim 1 wherein the non-LUT logic function is digital signal processing, the dedicated hardware is an infinite impulse response (IIR) filter.

* * * * *